United States Patent
Prasad et al.

(10) Patent No.: US 7,404,139 B2
(45) Date of Patent: Jul. 22, 2008

(54) DECODER WITH M-AT-A-TIME TRACEBACK

(75) Inventors: Mohit K. Prasad, Austin, TX (US);
Nitin Vig, Austin, TX (US); Arnab K. Mitra, Noida (IN); Amrit P. Singh, Punjab (IN); Gaurav Davra, Uttar Pradesh (IN)

(73) Assignee: Freescale Semiconductor, Inc., Austin, TX (US)

( * ) Notice: Subject to any disclaimer, the term of this patent is extended or adjusted under 35 U.S.C. 154(b) by 644 days.

(21) Appl. No.: 11/040,861

(22) Filed: Jan. 21, 2005

(65) Prior Publication Data

US 2006/0168502 A1 Jul. 27, 2006

(51) Int. Cl.
*H03M 13/03* (2006.01)
(52) U.S. Cl. .................................... 714/796
(58) Field of Classification Search ............... 714/796, 714/794, 797, 795, 791, 803
See application file for complete search history.

(56) References Cited

U.S. PATENT DOCUMENTS

| 5,355,376 | A | * | 10/1994 | Cox et al. | 714/795 |
| 5,912,908 | A | | 6/1999 | Cesari et al. | |
| 5,987,638 | A | * | 11/1999 | Yu et al. | 714/795 |
| 6,477,680 | B2 | | 11/2002 | Mujtaba | |

* cited by examiner

*Primary Examiner*—Jacques Louis-Jacques
*Assistant Examiner*—Fritz Alphonse
(74) *Attorney, Agent, or Firm*—Charles Bergere

(57) ABSTRACT

A Maximum Likelihood Sequence Estimation (MLSE) decoder that decodes an encoded sequence of data symbols includes a branch metric unit for computing branch metrics for each trellis stage of the encoded sequence, a path metric unit for computing a path metric for each trellis stage using the computed branch metrics, and an M-at-a-time traceback unit for performing an M-at-a-time traceback operation using the computed path metrics. The M-at-a-time traceback operation generates M decoded data symbols in a single M-at-a-time traceback operation.

13 Claims, 9 Drawing Sheets

DECODER WITH M-AT-A-TIME TRACEBACK

BACKGROUND OF THE INVENTION

The present invention relates generally to decoding of encoded data symbols, and more particularly to a traceback operation in Maximum Likelihood Sequence Estimation (MLSE) decoders.

Various error detection and correction techniques are used to increase the reliability of a communication system. The techniques involve encoding of the data symbol sequence to be transmitted, and decoding of the received encoded data symbol sequence. Therefore, before transmitting data over a communication channel, the data symbols are encoded into code sequences. This encoding can be performed using coding techniques such as convolutional coding. A receiver receives the encoded code sequences along with some noise such as communication channel noise. The noisy encoded code sequences then are decoded using a Maximum Likelihood Sequence Estimation (MLSE) decoder. MLSE decoders correct random errors that occur due to the acquired noise in the encoded sequence of data symbols.

The MLSE decoder decodes a convolutionally encoded data symbol sequence using prior knowledge of the possible encoder state transitions from a given state to the next state. The prior knowledge is based on the dependence of a given data state on past data. The state transitions that are permitted can be represented with a trellis diagram. Each node in the trellis diagram denotes the state of a data symbol sequence at a point in time. The branches connecting the nodes denote a state transition.

An MLSE decoder typically includes a branch metric unit, a path metric unit also referred to as an add-compare-select (ACS) operation unit, and a traceback unit. The branch metric unit calculates branch metrics of the trellis stages of the trellis diagram corresponding to the encoder. Branch metrics are code distances between input code sequences, and code sequences predicted in respective branches of the trellis diagram. The path metric unit calculates accumulated values, referred to as path metrics, of the branch metrics and selects paths with the least path metrics as surviving paths.

The traceback unit comprises a traceback memory, and performs a traceback operation to obtain the decoded data symbols. The traceback operation traces the maximum likelihood path through the trellis of state transitions and reconstructs the most likely path through the trellis to extract the original data sequence that was input to the encoder. The traceback operation involves memory accesses for performing memory read and write operations. A memory write operation comprises writing decision bits extracted from surviving paths into the traceback memory. A memory read operation comprises reading the stored decision bits from the traceback memory.

The traceback operation in the MLSE decoders typically requires memory access at a rate of $L*f/r$ reads/sec, where $L$ is the traceback length; $f$, measured in Hz, is the rate at which coded symbols are supplied to the decoder; and $1/r$ is the code rate. To prevent the decoder from overflowing with data, $f \geq f_{CODE\_SYMB}$, and $f_{CODE\_SYMB} = f_{DATA}/r$, where $f_{CODE\_SYMB}$ bits/sec is the coded symbol rate and $f_{DATA}$ bits/sec is the uncoded bit rate. Therefore, $f/r \geq f_{CODE\_SYMB}/r$.

The traceback length $L$ is typically of the order of $8*K$, where $K$ is the constraint length of the convolution encoder. Therefore, for typical applications, where the values of $K$ range from 5 to 9, the frequency of memory reads for traceback operations ranges from 40 to 72 times the rate at which coded symbols are supplied to the decoder. In systems where the data rate is high or the value of $f$ is large, the number of memory reads and the traceback operation speed increases by a large magnitude. This leads to unacceptably high power.

Various conventional MLSE decoders decode one symbol at a time during the traceback operation. The traceback memory length of such decoders is of the order of 6-7K. Since, such decoders decode only one symbol at a time, the number of memory accesses required to decode all of the encoded data symbols is large. Therefore, the clock rate requirement as well as the power consumption of such decoders is high.

Other known MLSE decoders perform full-frame traceback, i.e., the traceback operation is performed on an entire frame of input encoded data sequence, once the entire frame is received. In such decoders, the traceback memory size is kept equal to the maximum frame size. In addition, due to the reception of frames smaller than the maximum size, large amounts of traceback memory are unused. Thus, on the one hand there is a large memory requirement and on the other hand there is underutilisation of memory in such MLSE decoders.

Therefore, there is a need for MLSE decoders with reduced numbers of memory accesses during a traceback operation, which reduces the clock speed requirement and the power consumption of the decoder.

BRIEF DESCRIPTION OF THE DRAWINGS

The following detailed description of the preferred embodiments of the invention will be better understood when read in conjunction with the appended drawings. The present invention is illustrated by way of example and not limited by the accompanying figures, in which like references indicate similar elements.

DETAILED DESCRIPTION OF THE INVENTION

Figure 1A:
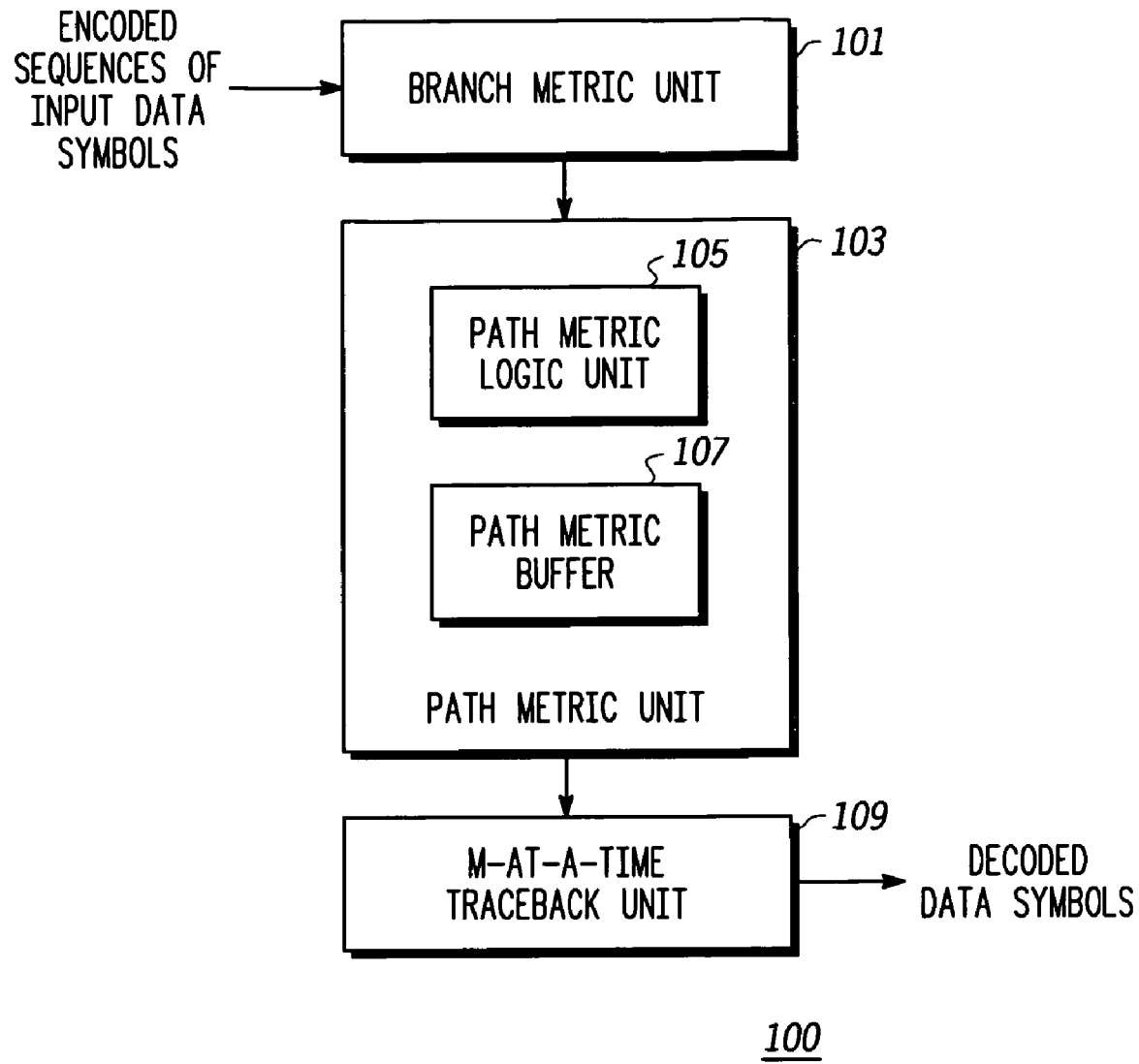
FIG. 1A is a schematic block diagram of an MLSE decoder according to an embodiment of the present invention.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

The present invention provides a method of decoding an encoded sequence of data symbols. The method comprises the steps of computing branch metrics for each trellis stage of the encoded data sequence, computing path metrics for each trellis stage using the computed branch metrics, and performing an M-at-a-time traceback operation using the computed path metrics to generate M decoded data symbols in a single M-at-a-time traceback operation. The values of M range from 1 to N, where N is the length of the encoded sequence of data symbols. These steps are repeated to obtain the decoded sequence of data symbols.

In an embodiment of the present invention, the step of computing path metrics further comprises the steps of identifying a surviving path at each trellis stage based on the computed path metric and storing a decision bit corresponding to the surviving path. The decision bit is the most significant bit of the previous state of a surviving path, wherein the previous state refers to the surviving path prior to the identified surviving path for the current trellis stage.

In another embodiment of the present invention, the traceback operation step comprises the step of identifying a beginning trellis stage for the M-at-a-time traceback operation. The M-at-a-time traceback operation begins when a predetermined number of decision bits have been stored. The M-at-a-time traceback operation further comprises the steps of reading M decision bits at each trellis stage beyond the identified beginning trellis stage, and generating M decoded data symbols at each trellis stage based on the read M decision bits. The steps of reading M decision bits and generating M decoded data symbols are repeated at each trellis stage until a predetermined number of data symbols remain to be decoded.

The present invention also provides an MLSE decoder for decoding an encoded sequence of data symbols. The MLSE decoder comprises a branch metric unit for computing branch metrics for each trellis stage of the encoded sequence, a path metric unit for computing a path metric and decision bit for each trellis stage using the computed branch metrics, and an M-at-a-time traceback unit for performing an M-at-a-time traceback operation using the computed decision bits to generate M decoded data symbols in a single M-at-a-time traceback operation.

In an embodiment of the present invention, the path metric unit comprises a path metric logic unit for computing path metrics for each trellis stage and identifying a surviving path at each stage, and a path metric buffer for storing the computed path metrics of the surviving paths.

In another embodiment of the present invention, the M-at-a-time traceback unit comprises a traceback memory for storing a decision bit for each trellis stage, the decision bit being extracted from the surviving path, a write pointer generation unit enabling the storing of the decision bit at a memory address in the traceback memory, read pointer generation unit for computing the memory addresses from which each of the stored decision bits are read from the traceback memory, read logic to read the stored decision bits from the traceback memory, a traceback decode unit for initiating reading of M decision bits for decoding M data symbols, and a register unit for arranging the generated decoded bits in a predetermined order.

Referring now to FIG. 1A, a schematic block diagram illustrating an MLSE decoder 100 according to an embodiment of the present invention is shown. The MLSE decoder 100 comprises a branch metric unit 101, a path metric unit 103 that includes a path metric logic unit 105 and a path metric buffer 107, and an M-at-a-time traceback unit 109. The MLSE decoder 100 decodes encoded sequences of input data symbols and outputs decoded data symbols. In an embodiment of the present invention, the input data symbols are encoded with a convolution encoder, which generates convolution codes.

A convolutional code is a sequence of encoded data symbols generated by passing the input data symbols sequentially through a series of binary shift registers. For example, if a 1/r code rate convolutional coding is used, then each input bit is encoded into r bits of data. The encoded bits are generated using code word polynomials and binary shift registers defined by constraint length, K.

In one embodiment of the present invention, turbo codes are used to encode the input data symbols. In an embodiment of the present invention, the decoding is performed using a decoding algorithm that includes a traceback technique. Examples of such decoders include Maximum a-priori (MAP) and Turbo decoders.

Figure 1B:
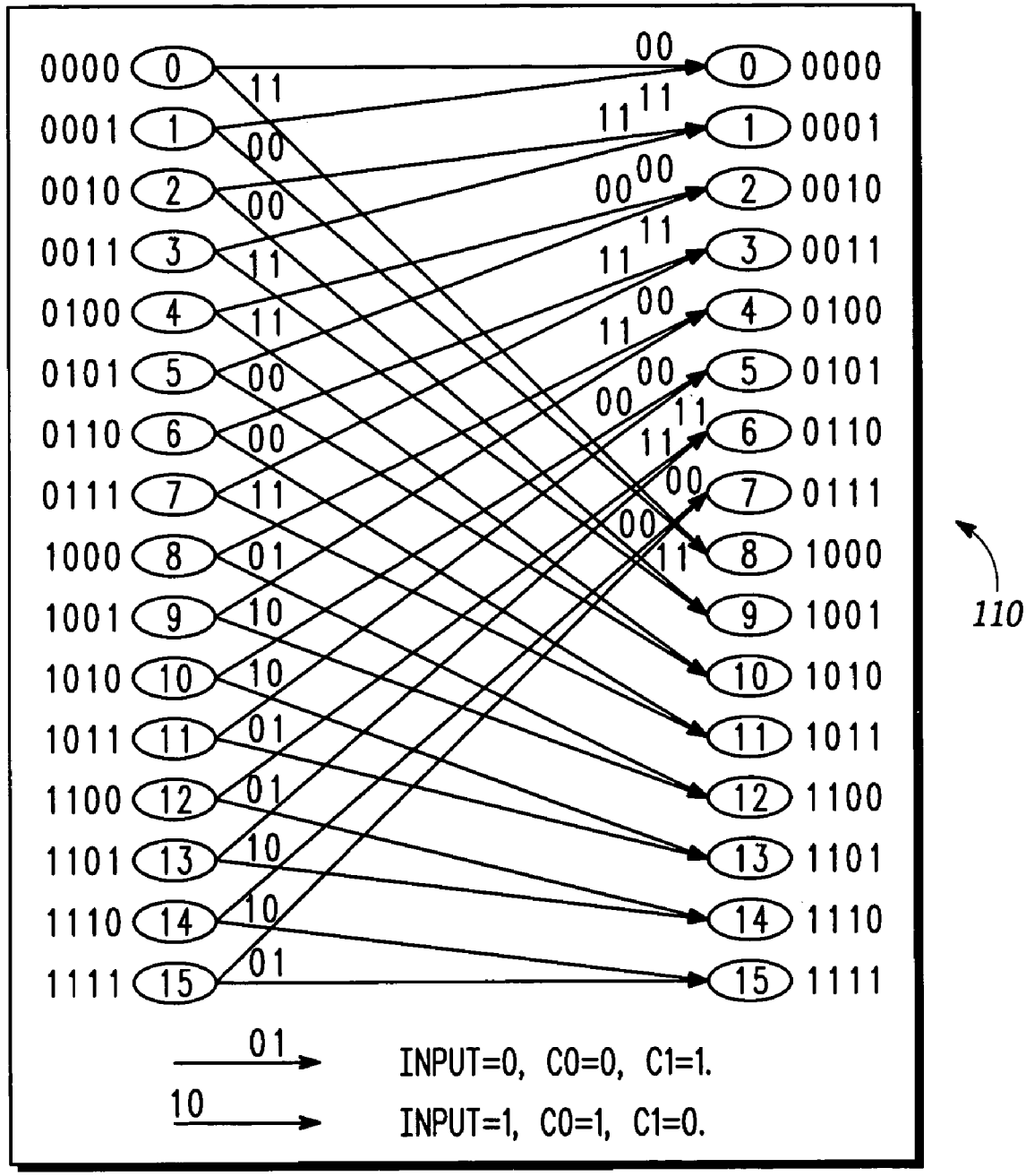
FIG. 1B is an exemplary trellis diagram for convolution encoding.

FIG. 1B is an exemplary trellis diagram 110 for a convolutionally encoded input data sequence. The trellis diagram 110 depicts the transition from a previous stage to a current stage based upon an input data sequence of data symbols (for example a 1-bit input data). The encoded data sequence is characterized by a constraint length, for example five. The trellis diagram 110 illustrates all possible previous states of the convolution encoder and their transitions to the next stage based on the 1-bit input data. As shown in the figure, for a constraint length of five, there are 16 possible states. Each stage of the trellis diagram 110 depicts a state of the convolution encoder.

In an embodiment of the present invention, the MLSE decoder 100 uses a viterbi decoding algorithm to decode the encoded sequences of input data symbols. The viterbi algorithm decodes a convolutionally encoded data symbol sequence using prior knowledge of the possible encoder state transitions from a given state to a next state. The prior knowledge is based on the dependence of a given data state on past data. The state transitions that are permitted can be represented using the trellis diagram 110. Each node in the trellis diagram 110 denotes the state of a data symbol sequence at a point in time. The branches connecting the nodes denote the state transitions.

The branch metric unit 101 computes the branch metric of each stage of the trellis diagram 110. The branch metric is a measure of the transition probability of one stage of the trellis diagram 110 to the next stage. The path metric unit 103 computes the path metric of each stage of trellis diagram 110. The path metric for a trellis stage is a sum of the computed branch metrics. The design and operation of the branch metric unit 101 and the path metric unit 103 are well known in the art.

The path metric logic unit 105 identifies a surviving path at each trellis stage. In order to identify the surviving paths, the path metric logic unit 105 adds the branch metrics of two competing paths at a node of the trellis diagram 110 to the path metrics of the node from which the competing paths originate. The new path metrics are then compared. The path with the smaller path metric is identified as the surviving path and is stored in the path metric buffer 107.

The M-at-a-time traceback unit 109 performs an M-at-a-time traceback operation, in order to decode the encoded sequences of input data symbols. The M-at-a-time traceback operation is performed after the path metrics for a predetermined number of stages in the trellis diagram 110 have been computed. The M-at-a-time traceback unit 109 performs the traceback operation using the computed decision bits to generate M decoded data symbols in a single M-at-a-time traceback operation. The value of M ranges from 1 to N, where N is the length of the encoded sequence of input data symbols.

In order to perform the M-at-a-time traceback operation, the M-at-a-time traceback unit 109 stores decision bits. In various embodiments of the present invention, a decision bit is the most significant bit (MSB) of the previous state of a surviving path, wherein the previous state refers to the surviving path prior to the identified surviving path for the current trellis stage. In an embodiment of the present invention, the encoded sequence of input data symbols corresponding to a stage in the trellis diagram 110 are obtained by left shifting the encoded sequence of input data symbols corresponding to a previous stage in the trellis diagram 110. The stored surviving paths are provided as input decision data to the M-at-a-time traceback unit 109, which then, extracts and stores decision bits from the input decision data. The storing of the extracted decision bits constitutes a memory write operation. Subsequently, the M-at-a-time traceback unit 109 reads the stored decision bits for decoding. The reading of the stored decision bits constitutes a memory read operation. The read decision bits are used to reconstruct the input data symbols corresponding to a previous stage in the trellis diagram 110. The input data symbols are reconstructed by right shifting a corresponding decision bit for the current stage in the trellis diagram 110. Therefore, the M-at-a-time traceback unit 109 outputs the decoded data symbols by repeatedly performing the above-mentioned operations, for the M encoded input data symbols at a time.

The M-at-a-time traceback unit 109 uses various parameters such as:
  System clock of MLSE decoder ($f_{sys}$)
  Constraint length of convolution encoder (K)
  Code rate (1/r)
  Number of decoded bits per M-at-a-time traceback operation (M)
  Traceback length (L)
  Minimum traceback length ($L_{min}$)
  Depth of traceback memory (P)
  Uncoded data rate ($f_{Data}$)
  Trellis completion rate ($f_{Trellis}$)
  Traceback read/write frequency ($f_{TB}$)
  Number of coded symbols per memory word ($N_p$)
  Number of cycles required to process a pair of trellis in path metric unit (Q; nominally Q=1)
  Ratio of a traceback clock to a trellis stage clock ($N_{TB}=f_{TB}/f_{Trellis}$)

The M-at-a-time traceback unit 109 is subject to various design constraints with respect to the above-mentioned parameters. Examples of such design constraints include:

Overflow Constraint I: For every set of new decision bits generated at each stage in the trellis diagram 110, there is an equal number of old decision bits that are read out from the M-at-a-time traceback unit 109. At any time, there are M new decoded bits. Consequently, there are M new sets of decision bits. The traceback length is L for all of these except the last. Therefore, at any given time a traceback buffer of depth P can store two new sets of decision bits. Therefore:

$$2M+L-1 \leq P \quad (1)$$

Overflow constraint II: The time required to read L+M bits during a traceback operation should be less than or equal to the time required to write M sets of decision bits. Since, $1/f_{TB}$ is the time taken to read one decision bit and $1/f_{Trellis}$ is the time required to compute a decision bit of one trellis stage, the resultant inequality is:

$$L+M/f_{TB} \leq M/f_{Trellis} \quad (2)$$

Minimum traceback length constraint: In order to perform M-at-a-time traceback operation, L should be greater than a minimum value. In an embodiment of the present invention, the minimum value of L is 8K. Therefore:

$$L \geq L_{min} = 8K \quad (3)$$

Symbol rate parity constraint: If the input sequence of encoded symbols coded at a rate of 1/r are read from the M-at-a-time traceback unit 109 at a rate of one (1) memory word per cycle, and each memory word contains $N_P$ packed coded symbols, then $r/N_P$ memory read operations are required to obtain each input encoded symbol every $1/f_{sys}$ seconds. If the uncoded data rate is $f_{DATA}$ then the inequality:

$$f_{DATA} \leq f_{sys}/(r/N_p) \quad (4)$$

prevents loss of incoming sequence of encoded symbols.

Path Metric Unit constraint: At each stage of the trellis diagram 110, 2K−2 trellis pairs are processed, each of which take Q (nominally Q=1) cycles. Therefore:

$$f_{Trellis}=f_{SYS}/(2^{(K-2)})*Q \quad (5)$$

Clock Speed constraint for Traceback memory accesses: The memory cannot be accessed faster than the fastest clock of the MLSE decoder 100. Therefore:

$$F_{TB}=f_{SYS} \quad (6)$$

In an embodiment of the present invention, the following simplified expressions for the length of the M-at-a-time traceback unit 109 are obtained using the above mentioned design constraints:

$$L \leq P-2M+2+1 \quad (7)$$

$$L \leq (N_{TB}-1)M \quad (8)$$

$$L \geq L_{min} \approx 8K \quad (9)$$

The following examples illustrate the usage of design equations (7), (8), and (9) to implement the M-at-a-time traceback unit 109 of the MLSE decoder 100.

EXAMPLE 1

By substituting K=7, M=4, P=64 and $L_{min}$=56 in equation (7), L≦57 is obtained, which in turn satisfies equation (9). Next, substituting the obtained value of L in equation (8) provides the additional constraint $N_{TB} \geq 15$. Therefore, if the value of $N_{TB}$ is chosen as 16 then the design constraint equations (7), (8) and (9) are satisfied. Hence, the M-at-a-time traceback unit 109 can be designed by substituting the above-mentioned values of the parameters in the design equations (7), (8) and (9).

EXAMPLE 2

By substituting K=5, M=8, P=64 and $N_{TB}$=8 in equations (7) and (8), L≦49 and L<=56 are obtained respectively. In addition, the lower bound L≧40 is obtained by performing the same substitution in equation (9). This indicates that the choice of the system parameters satisfies the design constraint equations (7), (8) and (9). Hence, the M-at-a-time traceback unit 109 can be designed by substituting the above-mentioned values of the parameters in the design equations (7), (8) and (9).

Figure 2:
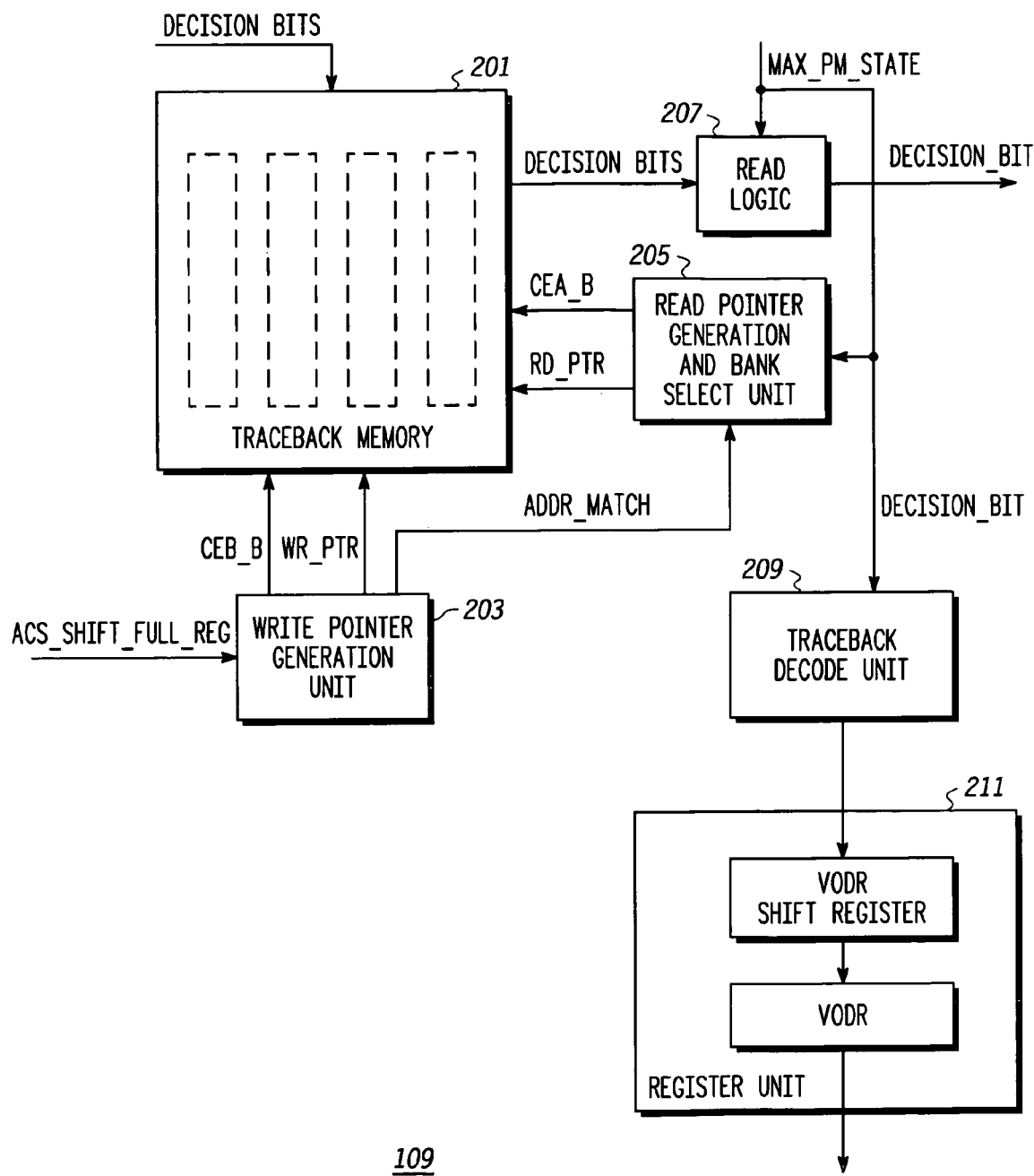
FIG. 2 is a schematic block diagram of an M-at-a-time traceback unit of the MSLE decoder of FIG. 1.

Referring now to FIGS. 2 through 5, a more detailed description of the MSLE decoder will be provided. FIG. 2 is a schematic block diagram illustrating the elements of the M-at-a-time traceback unit 109 of the MLSE decoder 100, according to an embodiment of the present invention. The M-at-a-time traceback unit 109 comprises a traceback memory (buffer) 201, a write pointer generation unit 203, a read pointer generation and bank select unit 205, read logic 207, a traceback decode unit 209 and a register unit 211.

In one embodiment of the present invention, the traceback memory 201 comprises a plurality of dual port memory banks to store decision bits. A decision bit is extracted from a surviving path at each trellis stage and stored in the traceback memory 201 in a memory write operation in groups of sixteen at a time. In an embodiment of the present invention, the traceback memory 201 comprises four banks of (64×16 each) dual port memory.

The write pointer generation unit 203 enables the writing of each decision bit at a particular memory address in the traceback memory 201. The memory write operation is initiated by a signal acs_shift_full_reg that is provided to the write pointer generation unit 203. The signal acs_shift_full_reg is a flag which signifies that the decision bits need to be written to the traceback memory 201. The signal wr_ptr specifies the memory address where a group of the decision bits are to be written. The signal ceb_b is the memory write enable which enables the write operation in one of the four banks of the traceback memory 201. The write pointer generation unit 203 also generates a signal addr_match, which is provided to the read pointer generation and bank select unit 205. The signal addr_match indicates to the read pointer generation unit and bank select unit 205 that decision bits corresponding a predetermined number of stages have been written to the traceback memory 201 and the traceback read operation can now start.

The read pointer generation and bank select unit 205 enables the reading of stored decision bits by computing memory addresses where the decision bits are stored. The read pointer generation and bank select unit 205 generates signals rd_ptr and cea_b, which are input to the traceback memory 201. The read logic 207 provides the logic to read the decision bit from the traceback memory 201. The memory read operation is initiated by a max_pm_state signal that is input to decision bit selection unit 507. The max_pm_state signal provides the stage of the trellis diagram 110 (FIG. 1B) from which the M-at-a-time traceback operation is commenced. A decision bit selection unit 507 (FIG. 5) generates the signal max_pm_state which is input to the read logic 207, read pointer generation and bank select unit 205, and traceback decode unit 209. The read logic 207 uses the max_pm_state signal to generate a signal decision_bit, which is input to the decision bit selection unit 507. Two multiplexers 509 and 511 are components of the read logic 207. The multiplexers 509 and 511 select one bit from sixty-four (64) bits which are collectively output by the traceback memory 201. The read bank select logic 505 is a component of the read pointer and read bank select logic unit 205. The read bank select logic 505 generates the signal cea_b, which enables the read operation in one of the four banks of the traceback memory 201.

The traceback decode unit 209 generates a signal to initiate reading and decoding of M bits in one traceback operation. The traceback decode unit 209 uses the max_pm_state signal to generate M bits in one traceback operation. The least significant bit of max_pm_state is treated as the decoded bit after the traceback operation has traversed a predetermined number of stages. The register unit 211 arranges the decoded bits in a predetermined order. In an embodiment of the present invention, the register unit 211 comprises at least one shift register, for example, a VODR shift register, which arranges the decoded bits in a predetermined order and stores them into a register to be read by a user.

Figure 3:
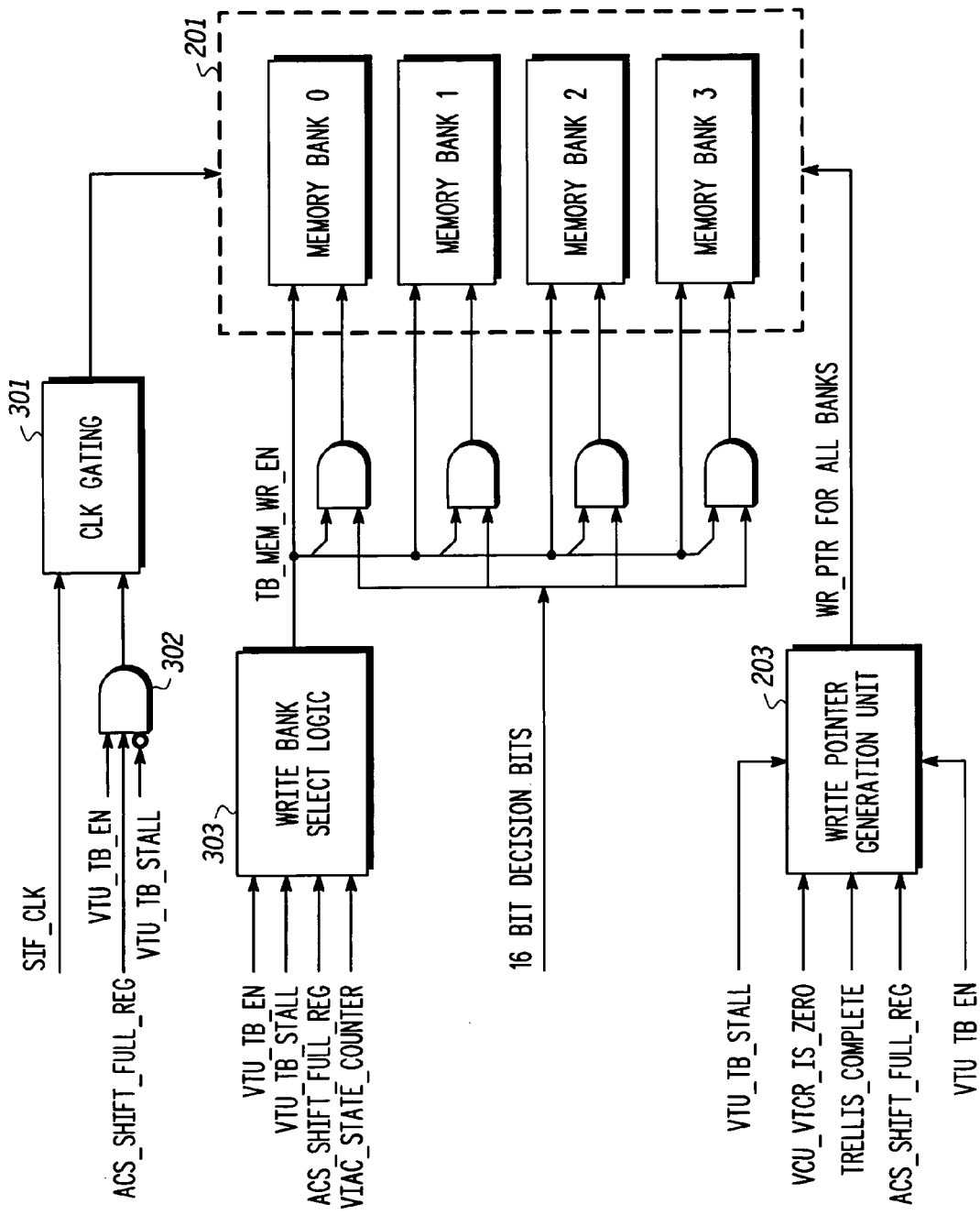
FIG. 3 is a functional block diagram of a circuit for performing a memory write operation in the M-at-a-time traceback unit of FIG. 2.

FIG. 3 is a functional block diagram of a circuit for performing a memory write operation in the M-at-a-time traceback unit 109 of the MLSE decoder 100. A clk gating 301, a write bank select logic 303 and the write pointer generation unit 203 enable the writing of, for example, a 16-bit input decision data provided by the path metric unit 103, in the traceback memory 201.

The clk gating 301 provides a clock signal to the traceback memory 201. Signals vtu_tb_en, acs_shift_full_reg and an inverted vtu_tb_stall signal are input to an AND gate 302. The output of the AND gate 302 and a signal sif_clk are input to a logic block called clk gating 301. The signal sif_clk is the system clock signal for the MLSE decoder 100. The clk gating 301 gates the input clock sif_sclk and allows the clock to reach the four banks of the traceback memory 201 only if a write operation has to take place on one of the four banks thereof. The clk gating 301 uses a standard clock gating cell whose functions are well known in art. The vtu_tb_en signal is used to enable the M-at-a-time traceback operation. In an embodiment of the present invention, if the vtu_tb_en signal has a zero value, the traceback operation is bypassed and the decision bits are passed on to a processor for performing a software traceback.

The signal acs_shift_full_reg is a flag, which if enabled, signifies that decision bits need to be written to the traceback memory 201. Acs_shift_full_reg can have a value of zero or one. The vtu_tb_stall signal signifies initiation of a second traceback operation before the completion of a first traceback operation. Therefore, enabling the vtu_tb_stall signal causes the second M-at-a-time traceback operation to stall. The second M-at-a-time traceback operation can start only after the completion of the first M-at-a-time traceback operation. Completion of an M-at-a-time traceback operation disables the vtu_tb_stall signal.

Signals vtu_tb_en, vtu_tb_stall, acs_shift_full_reg and viac_state_counter are input to the write bank select logic 303. The signal viac_state_counter is used to count the number of trellis stages corresponding to the constraint length for the encoded data sequence. For example, for a constraint length K=5, there are 16 trellis stages and for K=7, there are sixty-four (64) trellis stages. Bits 3 and 4 of the viac_state_counter are used to select a memory bank in the traceback memory 201 for storing the sixteen (16) bit long decision bits. The write bank select logic 303 uses the four input signals to generate a tb_mem_wr_en signal, which when provided to the traceback memory 201 enables a memory write operation.

Signals vtu_tb_en, acs_shift_full_reg, vtu_tb_stall, vcu_vtcr_is_zero and trellis_complete are input to the write pointer generation unit 203. A VTCR register (not shown) is used to program the frame length of decoded data symbols. The VTCR register is a down counter, which decrements with the completion of the computation of decision bits for a stage of the trellis diagram 110. Therefore, the vcu_vtcr_is_zero signal signifies the end of path metric calculations for a trellis stage. The write pointer generation unit 203 uses these input signals to generate a wr_ptr signal for all banks of the traceback memory 201. The wr_ptr signal provides a memory address of the required decision bits in the traceback memory 201. The signal trellis_complete indicates that all the states of the current stage have been processed by the path metric unit 103.

Figure 4:
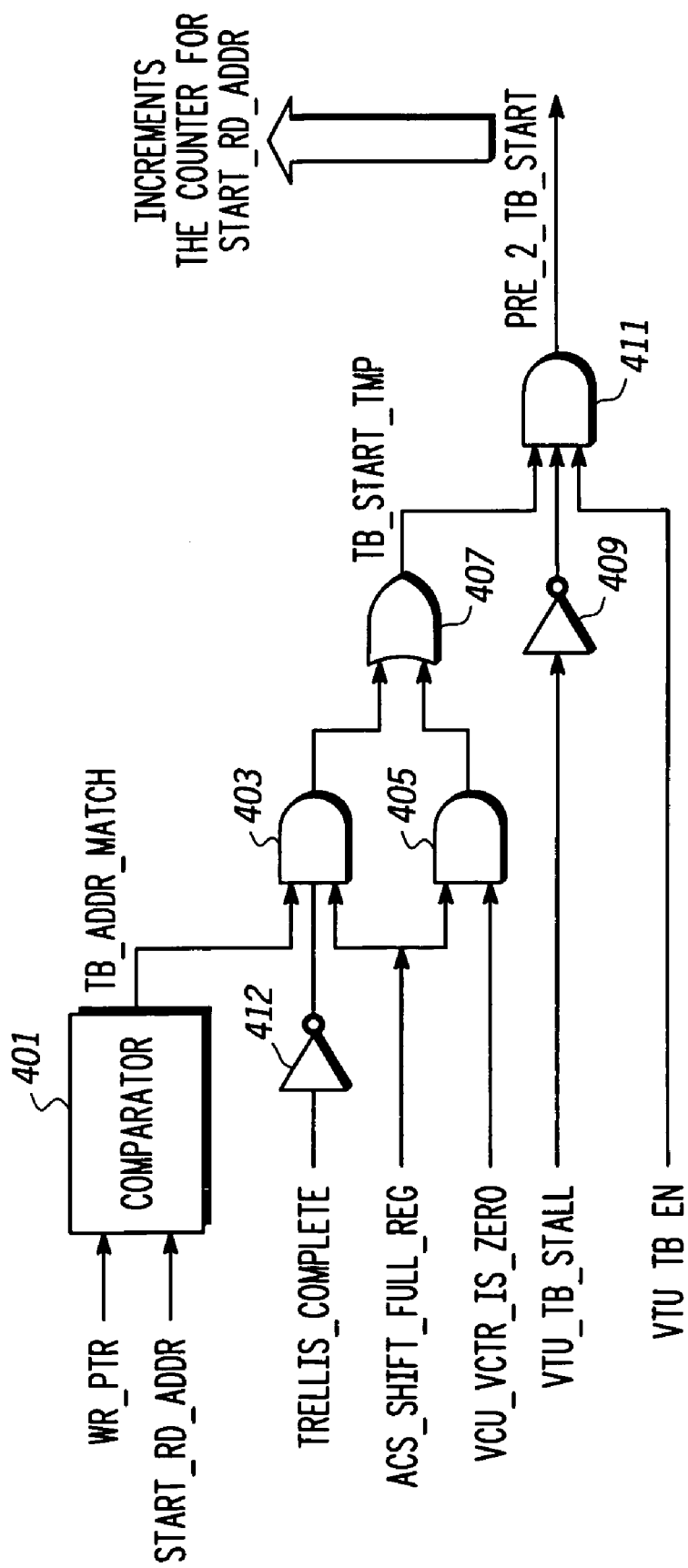
FIG. 4 is a schematic circuit diagram of a circuit for generating a memory read operation enable signal in the M-at-a-time traceback unit of FIG. 2.

FIG. 4 illustrates a schematic circuit diagram of a circuit to generate a signal enabling the memory read operation in the M-at-a-time traceback unit 109. The wr_ptr signal generated by the write pointer generation unit 203 and a start_rd_addr signal are input into a comparator 401, which in turn generates a tb_addr_match signal. The signal start_rd_addr indicates the address in the traceback memory 201 that the wr_ptr must reach before the traceback operation starts. The signal tb_addr_match indicates that the signals wr_ptr and start_rd_addr point to the same location in the traceback memory 201. Logic gates 403, 405, 407, 409, 411 and 412 are components of the read pointer generation and bank select unit 205.

The signal trellis_complete is input to an inverter 412. The output of the inverter 412 and the signals tb_addr_match and acs_shift_full_reg are input to an AND gate 403. The signals vcu_vtcr_is_zero and acs_shift_full_reg are input to an AND gate 405. The outputs of the AND gates 403 and 405 are provided to an OR gate 407 which, in turn generates a tb_start_tmp signal. The signal vtu_tb_stall is inverted by an inverter 409 and provided to an AND gate 411 along with the generated tb_start_tmp signal. The AND gate 411 uses the input signals to generate a pre_2_tb_start signal. The signal tb_start_tmp indicates that one of the conditions that can start with traceback operation has occurred and ensures that a new traceback operation starts only when the previous traceback operation has completed. The pre_2_tb_start signal increments a counter for the start_rd_addr signal and also is provided to the read pointer generation and bank select unit 205.

Figure 5:
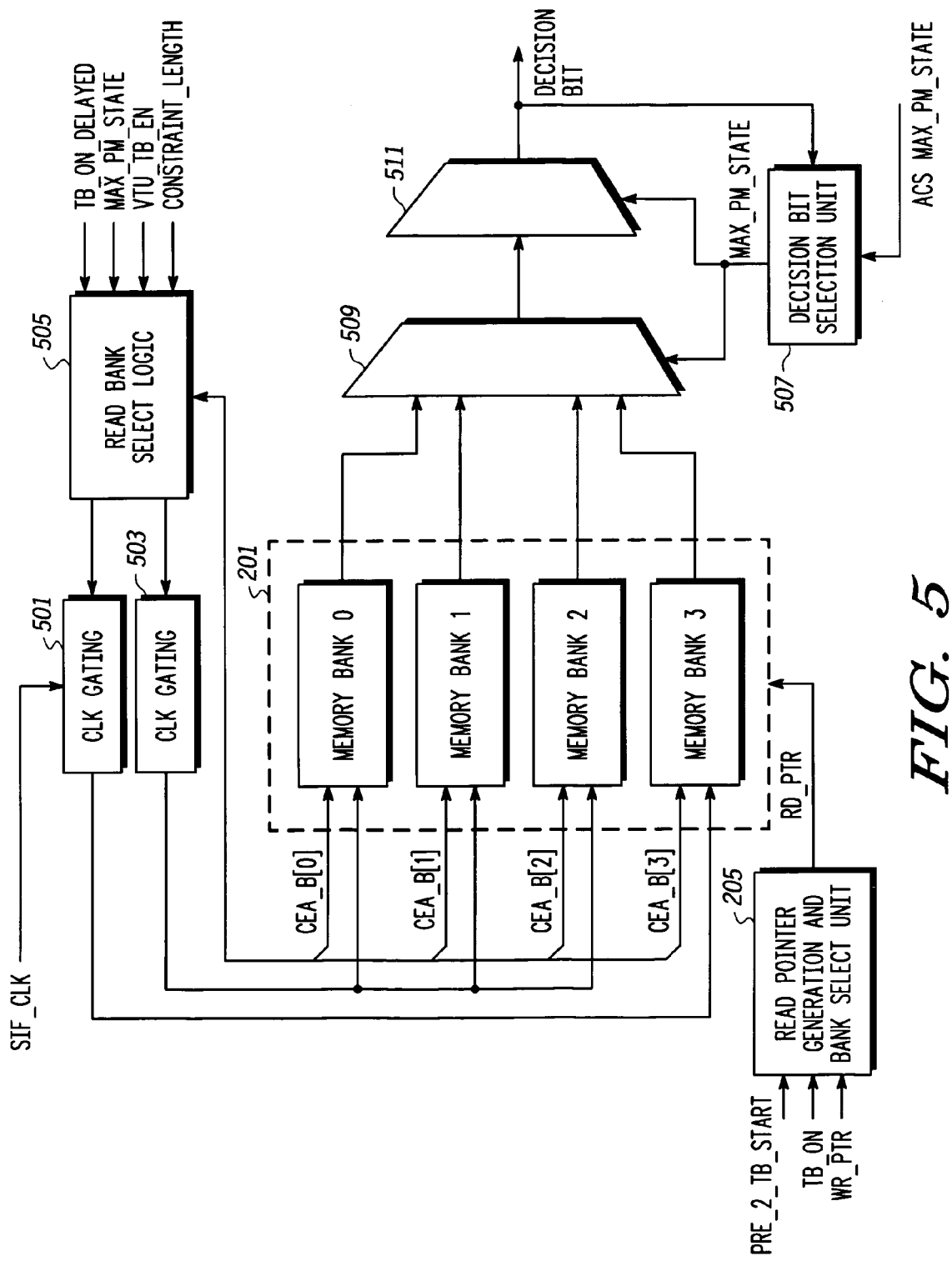
FIG. 5 is a schematic block diagram of a circuit for performing a memory read operation in the M-at-a-time traceback unit of FIG. 2.

FIG. 5 is a functional block diagram of a circuit for performing a memory read operation in the M-at-a-time traceback unit 109. The reading of the decision bits written in the traceback memory 201 are enabled by clk gatings 501 and 503, a read bank select logic 505, the read pointer generation and bank select unit 205, and a decision bit selection unit 507.

The clk gatings 501 and 503 each provide a clock signal to alternate banks of the traceback memory 201. Signals vtu_tb_en, tb_on_delayed, max_pm_state, and constraint_length are input to the read bank select logic 505. The signals generated by the read bank select logic 505 are provided to the clk gatings 501 and 503. In addition, the signal sif_clk is provided to the clk gating 501. As described earlier, the max_pmstate signal provides a starting trellis stage from which the M-at-a-time traceback operation is commenced. The signal tb_on_delayed is a delayed version of signal tb_on and signifies that the traceback read operation is being performed. The signal constraint_length defines the constraint length (K) of a convolution encoder.

The previously generated signals pre_2_tb_start and wr_ptr along with a tb_on signal are provided to the read pointer generation and bank select unit 205. The read pointer generation and bank select unit 205 uses the three input signals to generate an rd_ptr signal, which when input to the traceback memory 201 enables a memory read operation.

An acs_max_pmstate signal is provided to the decision bit selection unit 507, which in turn outputs the max_pmstate signal. The max_pm_state signal along with four 16-bit signals generated by the traceback memory 201 are input to a multiplexer 509. The multiplexer 509 selects one signal from the 16-bit signals generated by each bank of traceback memory 210. The selected 16-bit signal is input to a multiplexer 511 along with the max_pm_state signal generated by the decision bit selection unit 507. The multiplexer 511 generates a decision_bit signal indicating the selected decision bit that is input to the traceback decode unit 209.

Figure 6:
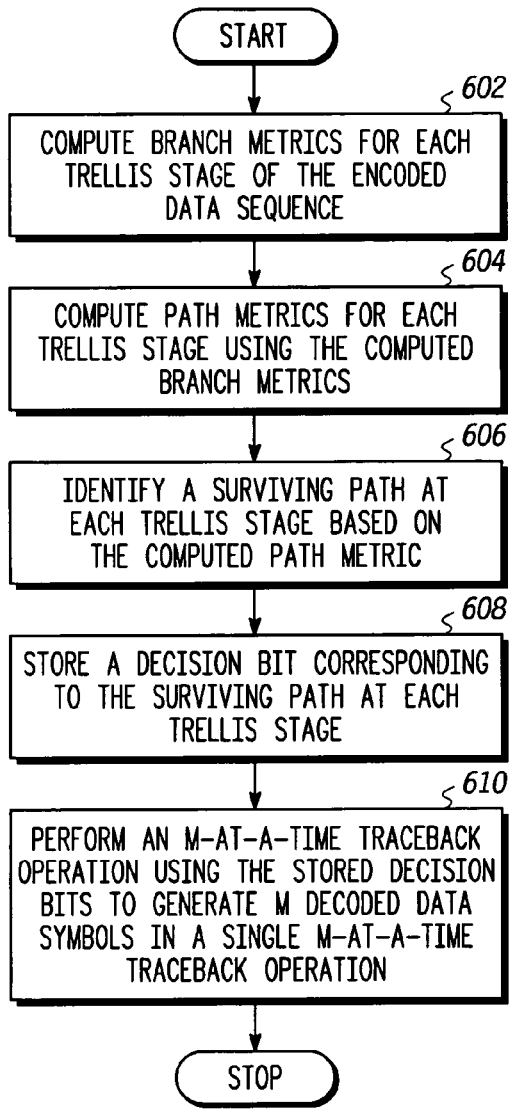
FIG. 6 is a flowchart illustrating a method to decode an encoded sequence of data symbols according to an embodiment of the present invention.

FIG. 6 is a flowchart illustrating a method of decoding an encoded sequence of data symbols according to an embodiment of the present invention. At step 602, branch metrics for each stage of the trellis diagram 110 are computed. At step 604, path metrics for each stage of the trellis diagram 110 are computed using the computed branch metrics. The branch metrics and the path metrics are computed using techniques well known in the art.

At step 606, a surviving path is identified at each stage of the trellis diagram 110 using the computed path metric for the corresponding stage. The surviving paths are identified by adding the branch metrics of two competing paths at a node to the path metrics of the node from which the paths originate in the trellis diagram 110. The new path metrics are then compared. The path with the smaller path metric is identified as a surviving path.

At step 608, a decision bit corresponding to each surviving path is stored by writing the decision bit in the traceback memory 201. At step 610, an M-at-a-time traceback operation is performed using the stored decision bits to generate M decoded data symbols in a single M-at-a-time traceback operation.

Figure 7:
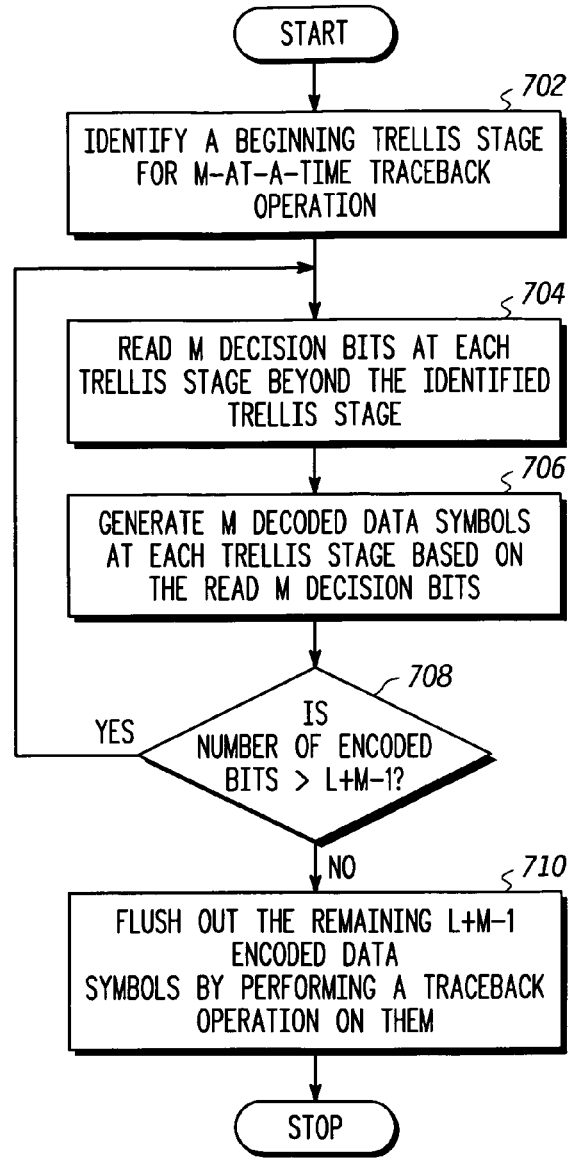
FIG. 7 is a flowchart illustrating the steps of an M-at-a-time traceback operation according to an embodiment of the present invention.

FIG. 7 is a flowchart illustrating the steps of an M-at-a-time traceback operation according to an embodiment of the present invention. At step 702, a beginning trellis stage of the trellis diagram 110 for initiating the M-at-a-time traceback operation is identified. In an embodiment of the present invention, the M-at-a-time traceback operation begins when L+M decision bits have been stored. L, the traceback length, is a maximum number of decision bits that can be stored at a time, in the traceback memory 201.

At step 704, M decision bits are read at each trellis stage beyond the identified stage in the trellis diagram 110. At step 706, M decoded data symbols are generated at each of the M-at-a-time traceback operation stages using the read M decision bits.

At step 708, it is determined whether the number of encoded bits to be decoded is greater than L+M−1. If the number of encoded bits to be decoded is greater than L+M−1, then steps 704 and 706 are performed again. If the number of encoded bits to be decoded is equal to or less than L+M−1, then at step 710 the remaining L+M−1 decoded data are flushed out by performing a traceback operation on the remaining L encoded data symbols in a single step.

Figure 8A:
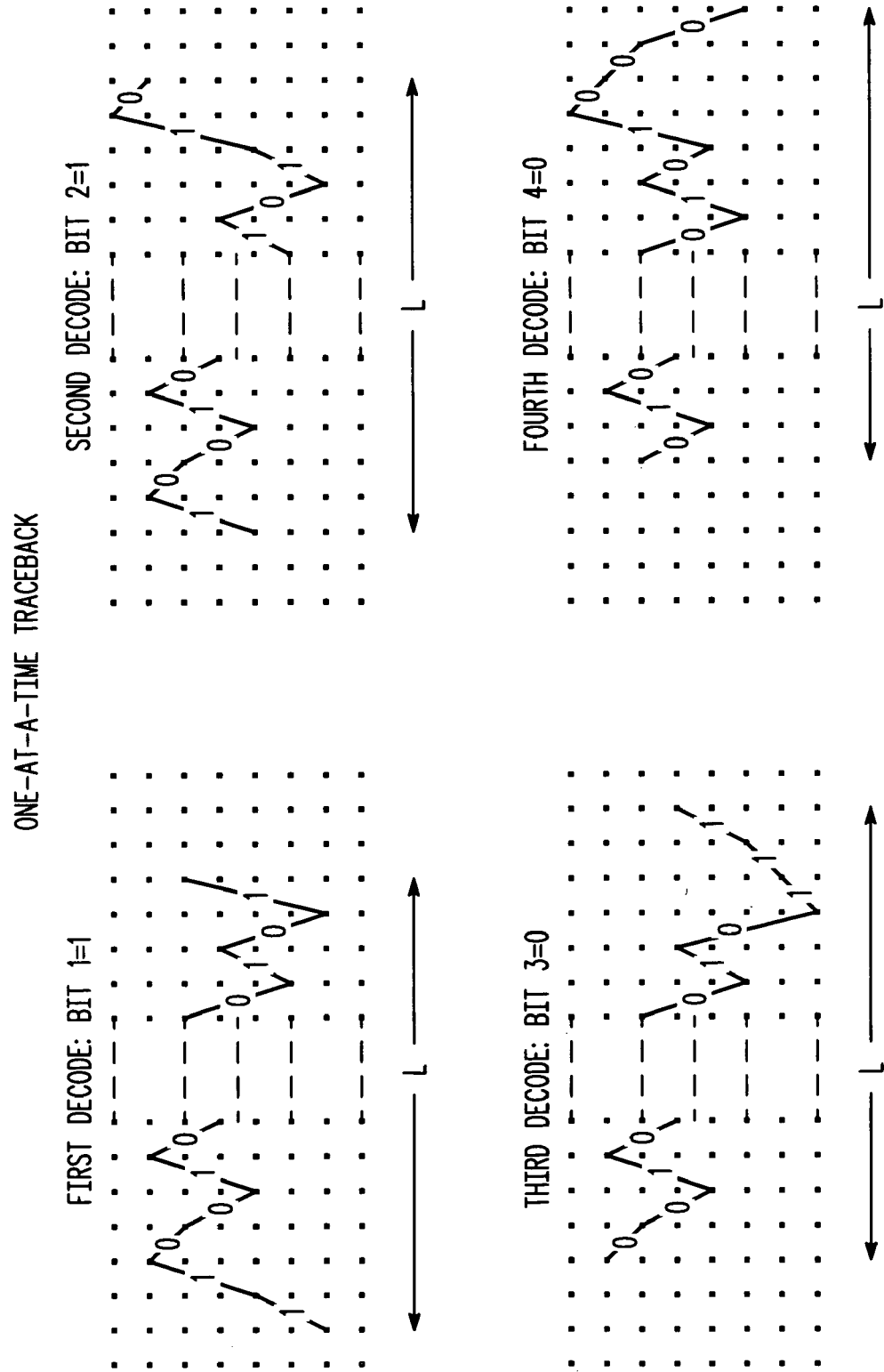
FIGS. 8A and 8B illustrate a comparison between a conventional One-at-a-time traceback operation and the M-at-a-time traceback operation of the present invention.
Figure 8B:
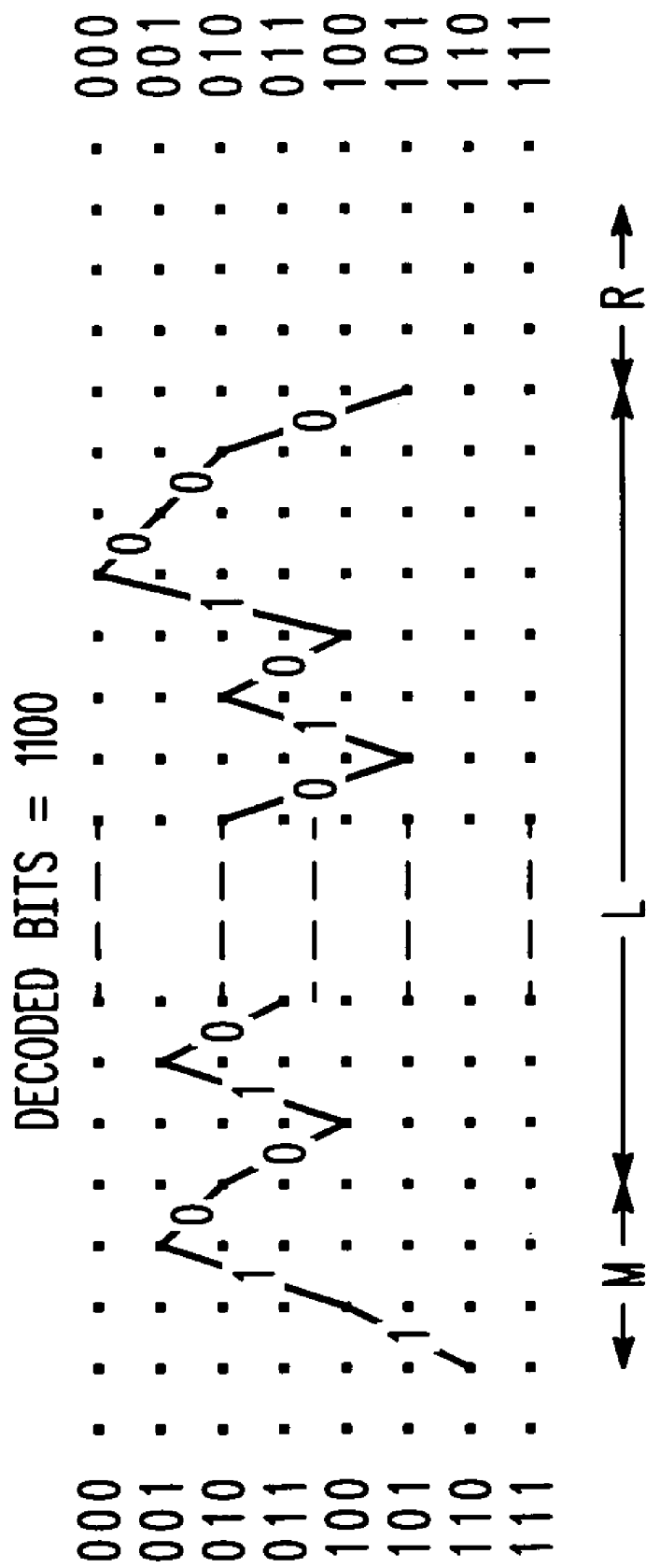

FIGS. 8A and 8B are diagrams that illustrate a comparison between a conventional One-at-a-time traceback operation and the M-at-a-time traceback operation of the present invention. FIG. 8A illustrates the decoding of four bits of encoded data symbols using a One-at-a-time traceback operation, when the traceback length is L. The decoding involves obtaining one decoded bit at a time. Therefore, four memory accesses, involving memory read and memory write operations are required to obtain the four decoded bits.

FIG. 8B illustrates the decoding of four bits of encoded data symbols using the M-at-a-time traceback operation described in the present invention. L signifies the traceback length, and M=4. The decoding involves obtaining M=4 decoded bit at a time. Therefore, a single memory access is required to obtain the four decoded bits.

The M-at-a-time traceback method described in the present invention has the advantage of reducing the number of required memory accesses. This advantage is illustrated by the following example:

In a convolutionally encoded frame having N bits of encoded bits, code rate 1/r, constraint length K, and traceback length L, the MLSE decoder 100 processes N stages of a trellis diagram. If it is assumed that N>L+M−1, then the traceback process begins after the processing of the first L+M−1 trellis stages. M decoded bits are produced at the end of the traceback process. M trellis stages later, M new sets of decision bits are written into the traceback memory, and the traceback process is repeated to generate M new decoded bits. This process is repeated until the last stage in the frame of encoded input data symbols is reached and then, the traceback memory is flushed.

Therefore, the total number of memory reads, $N_{MEM\_RD}$ is given by:

$$N_{\text{MEM\_RD}} = (L+M-1) \times \left[ \frac{N-(L+M-1)}{M} \right] + \qquad -(10)$$
$$L+M-1+(N-(L+M-1)) \bmod M$$

Equation (10) illustrates that the number of times the memory accessed is reduced to approximately half when M is doubled, thus the power consumption is reduced in the same proportion.

Another advantage of the M-at-a-time traceback method of the present invention is the reduction in the maximum clock speed required for the operation of the MLSE decoder. This advantage is illustrated by the following example:

If each trellis stage is computed in $1/f_{Trellis}$ seconds, then a rate 1/r, constraint length K code by using R≦r distinct code polynomials requires a data input clock of at least $rf_{TRELLIS}$, a branch metric unit clock of at least $2^{(K-1)}f_{TRELLIS}$, and a path metric clock rate of at least $2^{(K-2)}f_{TRELLIS}$. If the traceback length is L and M bits are decoded for each traceback operation, then the traceback unit requires a clock rate of $(1+(L-1)/M)f_{TRELLIS}$. The minimum required clock rate $f_{MIN\_CLK}$, is therefore given by the following equation:

$$f_{\text{MIN\_CLK}} = \qquad -(11)$$
$$\max \left\{ rf_{TRELLIS}, 2^{R-1} f_{TRELLIS}, 2^{K-2} f_{TRELLIS}, \left(1 + \frac{L-1}{M}\right) f_{TRELLIS} \right\}$$

For typical convolutional encoder parameters $r<2^{(K-2)}$, and $r<(K-1)$, where $2(K-1)<2(K-2)$, if $f_{sys}=2^{(K-2)}$, the minimum required clock rate $f_{MIN\_CLK}$, is given by the following equation:

$$f_{\text{MIN\_CLK}} = \max\left\{ 1, \frac{1}{2^{K-2}}\left(1 + \frac{L-1}{M}\right) \right\} \times f_{SYS} \qquad -(12)$$

Therefore, equation (12) illustrates that larger values of M lead to lower system clock requirements, thereby reducing the power and the timing constraints on the design of the MLSE decoder.

Other advantages of the M-at-a-time traceback method described in the present invention include higher throughput by a factor of M, and reduced current consumption during the decoding process.

The system, as described in the present invention or any of its components, may be embodied in the form of a computer system. Typical examples of a computer system include a general-purpose computer, a programmed microprocessor, a micro-controller, a peripheral integrated circuit element, and other devices or arrangements of devices that are capable of implementing the steps that constitute the method of the present invention.

The computer system comprises a computer, an input device, a display unit and a network, such as the Internet. The computer comprises a microprocessor and a memory. The microprocessor is connected to a communication bus. The memory may include Random Access Memory (RAM) and Read Only Memory (ROM) as well as other well known storage media. The computer system further comprises a storage device, which can be a hard disk drive or a removable storage drive such as a memory stick, optical disk drive and the like. The storage device can also be other similar means for loading computer programs or other instructions into the computer system.

The computer system executes a set of instructions that are stored in one or more storage elements, in order to process input data. The storage elements may also hold data or other information as desired. The set of instructions may include various commands that instruct the processing machine to perform specific tasks such as the steps that constitute the method of the present invention. The set of instructions may be in the form of a software program. The software may be in various forms such as system software or application software. Further, the software might be in the form of a collection of separate programs, a program module with a larger program or a portion of a program module. The software might also include modular programming in the form of object-oriented programming. In particular the modules of the semi-automatic converter may be coded a high level language such as, for example, C, C++ and Java. The processing of input data by the processing machine may be in response to user commands, or in response to results of previous processing or in response to a request made by another processing machine.

While the various embodiments of the present invention have been illustrated and described, it will be clear that the invention is not limited to these embodiments only. Numerous modifications, changes, variations, substitutions, and equivalents will be apparent to those skilled in the art without departing from the spirit and scope of the invention as described in the claims.

The invention claimed is:

1. A method of decoding an encoded sequence of data symbols, comprising the steps of:
    computing branch metrics for each state for each trellis stage of the encoded data sequence;
    computing path metrics for each state for each trellis stage using the computed branch metrics of a present trellis stage and the path metrics of a previous trellis stage;
    identifying a surviving path for each state at each trellis stage based on the computed path metric;
    storing a decision bit for each state corresponding to the surviving path, the decision bit being the most significant bit of a previous state of the surviving path; and
    performing an M-at-a-time traceback operation using the computed path metrics to generate M decoded data symbols in a single M-at-a-time traceback operation, wherein M ranges from 1 to N, N being a length of the encoded sequence of data symbols;
    wherein performing the M-at-a-time traceback operation comprises:
        identifying a beginning trellis stage for the M-at-time traceback operation;
        reading M decision bits at each trellis stage beyond the identified beginning trellis stage; and
        generating M decoded data symbols at each trellis stage based on the read M decision bits, wherein the steps of reading M decision bits and generating M decoded data symbols are repeated at each trellis stage until a predetermined number of data symbols remain to be decoded; and wherein each of the steps is repeated to obtain the decoded sequence of data symbols.

2. The decoding method of claim 1, wherein the M-at-a-time traceback operation step further comprises beginning the M-at-a-time trace back operation when decision bits for a predetermined number of trellis stages have been stored.

3. The decoding method of claim 2, wherein the predetermined number of stored decision bits comprises a maximum number of decisions bits that can be stored.

4. The decoding method of claim 2, wherein the M-at-a-time traceback operation further comprises the step of flushing out the remaining decoded data symbols.

5. The decoding method of claim 4, wherein the step of flushing out the remaining decoded data symbols comprises performing an M-at-a-time traceback operation on the remaining encoded data symbols.

6. The decoding method of claim 1, wherein the sequence of data symbols is encoded with a convolutional code.

7. A method of decoding an encoded sequence of data symbols, comprising the steps of:
   computing branch metrics for each state for each trellis stage of the encoded data sequence;
   computing path metrics for each state for each trellis stage using the computed branch metrics;
   identifying a surviving path for each state at each trellis stage based on the computed path metric;
   storing a decision bit corresponding to the surviving path for each state at each trellis stage, the decision bit being the most significant bit of a previous state of the surviving path; and
   performing an M-at-a-time traceback operation using the stored decision bits to generate M decoded data symbols in a single M-at-a-time traceback operation, wherein M ranges from 1 to N, N being a length of the encoded sequence of data symbols, and wherein the step of performing the M-at-a-time traceback operation comprises:
   identifying a beginning trellis stage for the M-at-a-time traceback operation, the M-at-a-time traceback operation beginning when L+M decision bits have been stored, wherein L is a maximum number of decision bits that can be stored at a time;
   reading M decision bits at each trellis stage beyond the identified trellis stage;
   generating M decoded data symbols at each trellis stage based on the read M decision bits, wherein the steps of reading M decision bits and generating M decoded data symbols are repeated at each trellis stage until L+M−1 data symbols remain to be decoded; and
   flushing out the remaining L+M−1 encoded data symbols by performing a traceback operation on the remaining L+M−1 encoded data symbols.

8. A Maximum Likelihood Sequence Estimation (MLSE) decoder for decoding an encoded sequence of data symbols, the MLSE decoder comprising:
   a branch metric unit for computing branch metrics for each stage at each trellis stage of the encoded sequence;
   a path metric unit for a computing path metric and decision bit for each state at each trellis stage using the computed branch metrics; and
   an M-at-a-time traceback unit for performing an M-at-a-time traceback operation using the computed decision bits to generate M decoded data symbols in a single M-at-a-time traceback operation, wherein M ranges from 1 to N, N being a length of the encoded sequence of data symbols, and
   wherein the M-at-a-time traceback unit further comprises:
      a traceback memory for storing the decision bit for each trellis stage, the decision bit being extracted from a surviving path at each trellis stage;
      a write pointer generation unit for enabling storing of the decision bit at a memory address in the traceback memory;
      a read pointer generation unit for computing the memory addresses from which each of the stored decision bits are read from the traceback memory, wherein the computed memory addresses being used for performing the traceback operation; and
      a read logic unit for providing the logic to read the stored decision bits from the traceback memory.

9. The MLSE decoder according to claim 8, wherein the sequence of data symbols is encoded with a convolutional code.

10. The MLSE decoder according to claim 8, wherein the path metric unit comprises:
    a path metric logic unit for computing the path metric for each stage at each trellis stage and identifying a surviving path at each stage; and
    a path metric buffer for storing the computed path metrics of the surviving paths.

11. The MLSE decoder according to claim 8, wherein the M-at-a-time traceback unit further comprises:
    a traceback decode unit for initiating reading of M decision bits and decoding of M data symbols; and
    a register unit for arranging the generated decoded bits in a predetermined order.

12. The MLSE decoder according to claim 11, wherein the traceback memory comprises a plurality of dual port memory banks.

13. The MLSE decoder according to claim 11, wherein the register unit comprises a plurality of shift registers.

* * * * *